US012684952B2

(12) United States Patent
Lee et al.

(10) Patent No.: US 12,684,952 B2
(45) Date of Patent: Jul. 14, 2026

(54) ELECTROLUMINESCENCE DISPLAY BLOCKING LATERAL LEAKAGE CURRENT BETWEEN PIXELS

(71) Applicant: LG Display Co., Ltd., Seoul (KR)

(72) Inventors: Joonsuk Lee, Paju-si (KR); Doyoung Kum, Paju-si (KR); Sejune Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 855 days.

(21) Appl. No.: 17/868,620

(22) Filed: Jul. 19, 2022

(65) Prior Publication Data

US 2023/0189572 A1 Jun. 15, 2023

(30) Foreign Application Priority Data

Dec. 13, 2021 (KR) ........................ 10-2021-0177811

(51) Int. Cl.
*H10K 59/122* (2023.01)
*H10K 59/121* (2023.01)
*H10K 59/123* (2023.01)

(52) U.S. Cl.
CPC ....... *H10K 59/122* (2023.02); *H10K 59/1213* (2023.02); *H10K 59/123* (2023.02)

(58) Field of Classification Search
CPC . H10K 59/122; H10K 59/1213; H10K 59/123
USPC .......................................................... 257/40
See application file for complete search history.

(56) References Cited

U.S. PATENT DOCUMENTS

| | | | |
|---|---|---|---|
| 11,322,698 B2 | 5/2022 | Lee et al. | |
| 2020/0136068 A1 | 4/2020 | Lee et al. | |
| 2021/0005700 A1* | 1/2021 | Park ..................... | H10K 59/131 |

FOREIGN PATENT DOCUMENTS

| | | |
|---|---|---|
| CN | 112185997 A | 1/2021 |
| EP | 3761366 A1 | 1/2021 |
| KR | 10-0656675 B1 | 12/2006 |
| KR | 10-2016-0127459 A | 11/2016 |

(Continued)

OTHER PUBLICATIONS

English translation of KR 2018/0013226 A1, Beak et al. (Year: 2018).*

(Continued)

*Primary Examiner* — Xia L Cross

(74) *Attorney, Agent, or Firm* — Fenwick & West LLP

(57) ABSTRACT

The present disclosure relates to an electroluminescence display. An electroluminescence display according to the present disclosure comprises: a pixel disposed on a substrate; a low resistance line disposed as one side of the pixel; a passivation layer on the low resistance line covering whole of the substrate; a planarization layer on the passivation layer covering whole of the substrate; a cathode contact hole exposing some of the low resistance line; an anode electrode disposed on the planarization layer; an under-cut trench formed at the planarization layer disposed between the anode electrode and the cathode contact hole; a bank covering circumference area of the anode electrode; an emission layer on the bank, the anode electrode and the planarization layer and a cathode electrode on the emission layer, wherein the cathode electrode connects the low resistance line through the cathode contact hole.

21 Claims, 8 Drawing Sheets

(56)         References Cited

FOREIGN PATENT DOCUMENTS

KR      10-2017-0078969  A      7/2017
KR      10-2017-0128742  A      11/2017
KR      10-2018-0013226  A      2/2018
KR      10-2020-0044520  A      4/2020
KR           20200044520  A  *  4/2020   .........  H01L 27/3246
KR      10-2020-0049115  A      5/2020

OTHER PUBLICATIONS

European Patent Office, Extended European Search Report and Opinion, EP Patent Application No. 22197692.1, Apr. 21, 2023, eight pages.

* cited by examiner

ELECTROLUMINESCENCE DISPLAY BLOCKING LATERAL LEAKAGE CURRENT BETWEEN PIXELS

CROSS-REFERENCE TO RELATED APPLICATIONS

This application claims the benefit of Korean Patent Application No. 10-2021-0177811 filed on Dec. 13, 2021 which is hereby incorporated by reference as if fully set forth herein.

BACKGROUND

Field of the Invention

The present disclosure relates to an electroluminescence display. Especially, the present disclosure relates to an electroluminescence display having an improved image quality stability by eliminating or blocking the lateral leakage current between neighboring pixels. In addition, the present disclosure relates to an electroluminescence display having an improved image quality stability by lowering the resistance of the cathode electrode adopting an auxiliary cathode line.

Discussion of the Related Art

Recently, various type of display such as the cathode ray tubes (CRTs), the liquid crystal displays (LCDs), the plasma display panels (PDPs) and the electroluminescent displays have been developed. These various types of display are used to display image data of various products such as computer, mobile phones, bank deposit and withdrawal devices (ATMs), and vehicle navigation systems according to their unique characteristics and purposes.

In particular, the organic light emitting diode display, which is a self-luminous display, has excellent optical performance such as wide viewing angle and high color reproducibility, and its application field is gradually widened, so it is in the spotlight for an high quality image display device. Due to these advantages, it is attracting attention as the most suitable display device for implementing 8K ultra-high resolution displays beyond 4K. As the resolution is increased, the size of the emission area occupied in the pixel also becomes smaller. In order to maximize the size of the emission area, it is preferable to apply a top emission type structure.

In the top emission type advantageous for the ultra-high resolution, it is preferable to use a transparent conductive material for the cathode electrode. Since the transparent conductive material has a higher sheet resistance than the metal material, it may be difficult to maintain a constant cathode voltage when implementing a large-area display device. Accordingly, in a large area electroluminescent display having a top emission type, a structure for connecting to a signal line having a low-resistance may be required in order to lower the sheet resistance of the cathode electrode.

In addition, as the resolution increases, the distance between pixels in the electroluminescence display becomes narrower. In this case, electrons or holes may leak in the lateral (or horizontal) direction along the functional layer included into the emission layer (or light emitting layer) between neighboring pixels. As the result, a problem of inaccurate color reproduction may be occurred.

In order to implement a top emission type electroluminescence display with a large area and ultra-high resolution, there are many conditions to be considered, and when all of these conditions are not satisfied, problems of image quality deterioration may be occurred. Accordingly, there is a growing need to develop an electroluminescence display having a new structure that has a large area, realizes ultra-high resolution, and does not cause image quality degradation.

SUMMARY

The purpose of the present disclosure, as for solving the problems described above, is to provide an electroluminescence display having a large-area ultra-high resolution and excellent image quality. Another purpose of the present disclosure is to provide an electroluminescence display in which a cathode voltage may be maintained constant in a top emission type display suitable for implementing the ultra-high-resolution structure. Still another purpose of the present disclosure is to provide an ultra-high-resolution electroluminescence display that minimizes the effect of parasitic currents among densely arranged pixels.

In order to accomplish the above mentioned purposes of the present disclosure, an electroluminescence display according to the present disclosure comprises: a pixel disposed on a substrate; a low resistance line disposed on one side of the pixel; a passivation layer on the low resistance line covering the entire substrate; a planarization layer on the passivation layer covering the entire substrate; a cathode contact hole exposing a part of the low resistance line; an anode electrode disposed on the planarization layer; an under-cut trench formed in the planarization layer disposed between the anode electrode and the cathode contact hole; a bank covering a circumference area of the anode electrode; an emission layer on the bank, the anode electrode and the planarization layer and a cathode electrode on the emission layer, wherein the cathode electrode is connected to the low resistance line through the cathode contact hole.

In an example embodiment, the electroluminescence display further comprises: a pixel trench formed by removing a part of the planarization layer around the anode electrode outside of the bank.

In an example embodiment, the emission layer extends to a neighboring pixel through the pixel trench.

In an example embodiment, the cathode contact hole is formed at some areas overlapped with the low resistance line at the pixel trench.

In an example embodiment, the cathode contact hole includes: a first aperture formed at the passivation layer and having a first width; and a second aperture formed at the planarization layer and having a second width narrower than the first width. The emission layer is disposed on some of the low resistance line exposed as corresponding to the second width. The cathode electrode is connected to the low resistance line.

In an example embodiment, a ratio of a depth of the under-cut trench to a thickness of the planarization layer is any one of 1:1 to 3:4.

In an example embodiment, the bank is disposed between the anode electrode and the under-cut trench.

In an example embodiment, the bank fills the under-cut trench and covers a part of the planarization layer.

In an example embodiment, the bank does not cover portions of the planarization layer between the under-cut trench and the cathode contact hole.

In an example embodiment, the electroluminescence display further comprises: a thin film transistor disposed under the passivation layer and connected to the anode electrode.

In addition, the electroluminescence display according to the present disclosure comprises: a first pixel and a second pixel disposed next to each other on a substrate; a low resistance line disposed between the first pixel and the second pixel; a passivation layer on the low resistance line and covering the substrate; a first planarization layer disposed at the first pixel on the passivation layer; a second planarization layer disposed at the second pixel on the passivation layer; a first anode electrode on the first planarization layer; a second anode electrode on the second planarization layer; a cathode contact hole exposing a part of the low resistance line between the first planarization layer and the second planarization layer; a first under-cut trench formed at the first planarization layer between the first anode electrode and the cathode contact hole; a second under-cut trench formed at the second planarization layer between the second anode electrode and the cathode contact hole; a first bank covering circumference areas of the first anode electrode; a second bank covering circumference areas of the second anode electrode; an emission layer on the first bank, the second bank, the first anode electrode, the second anode electrode, the first planarization layer and the second planarization layer; and a cathode electrode on the emission layer, wherein the cathode electrode is connected to the low resistance line through the cathode contact hole.

In an example embodiment, the electroluminescence display further comprises: a pixel trench disposed between the first planarization layer and the second planarization layer, and exposing the passivation layer.

In an example embodiment, the emission layer extends from the first pixel to the second pixel via the pixel trench.

In an example embodiment, the cathode contact hole is formed at some portions overlapped with the low resistance line in the pixel trench.

In an example embodiment, the cathode contact hole comprises: a first aperture formed at the passivation layer and having a first width; a second aperture formed between the first planarization layer and the second planarization layer, and having a second width narrower than the first width. The emission layer is disposed on some of the low resistance line exposed as corresponding to the second width. The cathode electrode is connected to the low resistance line exposed as corresponding to the first width.

In an example embodiment, a ratio of a depth of the under-cut trench and a thickness of the first planarization layer, and a ratio of the depth of the under-cut trench and a thickness of the second planarization layer are any one of 1:1 to 3:4.

In an example embodiment, the first bank exposes the first under-cut trench and the first planarization layer. The second bank exposes the second under-cut trench and the second planarization layer.

In an example embodiment, the first bank fills the first under-cut trench. The second bank fills the second under-cut trench.

In an example embodiment, the first bank does not cover some of the first planarization layer between the first under-cut trench and the cathode contact hole. The second bank does not cover some of the second planarization layer between the second under-cut trench and the cathode contact hole.

In still another embodiment, an electroluminescence display comprises a first pixel including a first transistor and a first light emitting diode, the first light emitting diode including a first anode, a first emission layer, and a cathode; a second pixel including a second transistor and a second light emitting diode, the second light emitting diode including a second anode, a second emission layer, and the cathode; a passivation layer covering the first transistor and the second transistor; a planarization layer between the passivation layer and the first and second light emitting diodes; a low resistance line between the first pixel and the second pixel; a cathode contact hole between the first pixel and the second pixel, the cathode contact hole formed through the planarization layer and through a part of the passivation layer and exposing a part of the low resistance line; and a dummy emission layer formed of a same material as the first emission layer and the second emission layer in the cathode contact hole on the part of the low resistance line exposed by the cathode contact hole, the dummy emission layer electrically disconnected from the first emission layer and the second emission layer, wherein the cathode is formed continuously on sidewalls of the cathode contact hole, the part of the low resistance line, and the dummy emission layer.

The electroluminescence display may further comprise a first bank between the first pixel and the cathode contact hole; a second bank between the second pixel and the second contact hole; a first undercut trench formed in the planarization layer between the first bank and the cathode contact hole, the first undercut trench spaced apart from the cathode contact hole; and a second undercut trench formed in the planarization layer between the second bank and the cathode contact hole, the second undercut trench spaced apart from the cathode contact hole.

In some embodiments, the first bank fills the first undercut trench and the second bank fills the second undercut trench. In another embodiment, the first and the second undercut trenches expose the passivation layer.

The electroluminescent display according to the present disclosure provides a top emission type electroluminescence display capable of maximizing an aperture ratio of an emission region to a pixel area in order to implement the ultra-high resolution. Forming a pixel trench by removing the planarization layer between pixels, even when the gap between pixels becomes narrower as the ultra-high resolution is implemented, the present disclosure may provide a structure capable of suppressing the lateral leakage current between the pixels. Accordingly, there is no deterioration in image quality due to leakage current even at ultra-high resolution. Furthermore, in implementing a top emission type large area electroluminescence display having a large diagonal area, the sheet resistance of the cathode electrode may be maintained constant over the whole area of the display. As the result, it is possible to provide stable image quality by maintaining a constant cathode voltage even in a large-area electroluminescence display. That is, the electroluminescence display according to the present disclosure may provide excellent image quality in an ultra-high resolution and large-area electroluminescence display.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
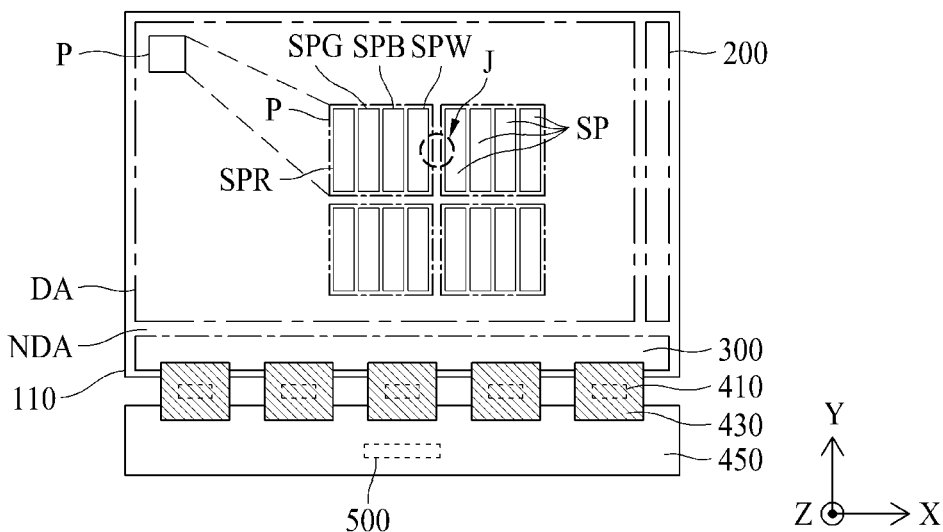
FIG. 1 is a plane view illustrating a schematic structure of an electroluminescence display according to the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings in order to describe various example embodiments of the present disclosure, are merely given by way of example. Therefore, the present disclosure is not limited to the illustrated details. Like reference numerals refer to like elements throughout the specification unless otherwise specified. In the following description, where the detailed description of the relevant known function or configuration may unnecessarily obscure an important point of the present disclosure, a detailed description of such known function of configuration may be omitted.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

In the present specification, where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is construed as including an error or tolerance range even where no explicit description of such an error or tolerance range is provided.

In the description of the various embodiments of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween. Also, if a first element is described as positioned "on" a second element, it does not necessarily mean that the first element is positioned above the second element in the figure. The upper part and the lower part of an object concerned may be changed depending on the orientation of the object. Consequently, where a first element is described as positioned "on" a second element, the first element may be positioned "below" the second element or "above" the second element in the figure or in an actual configuration, depending on the orientation of the object.

In describing a temporal relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

In describing various elements in the present disclosure, terms such as first, second, A, B, (a), and (b) may be used. These terms are used merely to distinguish one element from another, and not to define a particular nature, order, sequence, or number of the elements. Where an element is described as being "linked", "coupled," or "connected" to another element, that element may be directly or indirectly connected to that other element unless otherwise specified. It is to be understood that additional element or elements may be "interposed" between the two elements that are described as "linked," "connected," or "coupled" to each other.

It should be understood that the term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, an example of a display apparatus according to the present disclosure will be described in detail with reference to the attached drawings. Wherever possible, the same reference numbers will be used throughout the drawings to refer to the same or like parts. Since a scale of each of elements shown in the accompanying drawings may be different from an actual scale for convenience of description, the present disclosure is not limited to the scale shown in the drawings.

Hereinafter, referring to the attached figures, the present disclosure will be explained. FIG. 1 is a plane view illustrating a schematic structure of an electroluminescence display according to the present disclosure. In FIG. 1, X-axis refers to the direction parallel to the scan line, Y-axis refers to the direction of the data line, and Z-axis refers to the height direction of the display device.

Referring to FIG. 1, the electroluminescence display comprises a substrate 110, a gate (or scan) driver 200, a data pad portion 300, a source driving IC (Integrated Circuit) 410, a flexible film 430, a circuit board 450, and a timing controller 500.

The substrate 110 may include an electrical insulating material or a flexible material. The substrate 110 may be made of a glass, a metal or a plastic, but it is not limited thereto. When the electroluminescence display is a flexible display, the substrate 110 may be made of the flexible material such as plastic. For example, the substrate 110 may include a transparent polyimide material.

The substrate 110 may include a display area DA and a non-display area NDA. The display area DA, which is an area for representing the video images, may be defined as the majority middle area of the substrate 110, but it is not limited thereto. In the display area DA, a plurality of scan lines (or gate lines), a plurality of data lines and a plurality of pixels P may be formed or disposed. Each of pixels may include a plurality of sub pixels SP. Each of sub pixels includes the scan line and the data line, respectively. For example, one of pixel P may include three sub pixels SP or four sub pixels SP.

The non-display area NDA, which is an area not representing the video images, may be defined at the circumference areas of the substrate 110 surrounding all or some of the display area DA. In the non-display area NDA, the gate driver 200 and the data pad portion 300 may be formed or disposed.

The gate driver 200 may supply the scan (or gate) signals to the scan lines according to the gate control signal received from the timing controller 500. The gate driver 200 may be formed at the non-display area NDA at any one outside of the display area DA on the substrate 110, as a GIP (Gate driver In Panel) type. GIP type means that the gate driver 200 is directly formed on the substrate 110.

The data pad portion 300 may supply the data signals to the data line according to the data control signal received from the timing controller 500. The data pad portion 300 may be made as a driver chip and mounted on the flexible film 430. Further, the flexible film 430 may be attached at the non-display area NDA at any one outside of the display area DA on the substrate 110, as a TAB (Tape Automated Bonding) type.

The source driving IC 410 may receive the digital video data and the source control signal from the timing controller 500. The source driving IC 410 may convert the digital video data into the analog data voltages according to the source control signal and then supply that to the data lines. When the source driving IC 410 is made as a chip type, it may be installed on the flexible film 430 as a COF (Chip On Film) or COP (Chip On Plastic) type.

The flexible film 430 may include a plurality of first link lines connecting the data pad portion 300 to the source driving IC 410, and a plurality of second link lines connecting the data pad portion 300 to the circuit board 450. The flexible film 430 may be attached on the data pad portion 300 using an anisotropic conducting film, so that the data pad portion 300 may be connected to the first link lines of the flexible film 430.

The circuit board 450 may be attached to the flexible film 430. The circuit board 450 may include a plurality of circuits implemented as the driving chips. For example, the circuit board 450 may be a printed circuit board or a flexible printed circuit board.

The timing controller 500 may receive the digital video data and the timing signal from an external system board through the line cables of the circuit board 450. The timing controller 500 may generate a gate control signal for controlling the operation timing of the gate driver 200 and a source control signal for controlling the source driving IC 410, based on the timing signal. The timing controller 500 may supply the gate control signal to the gate driver 200 and supply the source control signal to the source driving IC 410. Depending on the product types, the timing controller 500 may be formed as one chip with the source driving IC 410 and mounted on the substrate 110.

Referring to the planar structure of the pixel P array as shown in FIG. 1, the electroluminescence display according to the present disclosure may have a plurality of pixels P arrayed in a matrix manner Each of pixels P may include four sub-pixels SP. For example, one of pixel P may include a red sub-pixel SPR, a green sub-pixel SPG, a blue sub-pixel SPB and a white sub-pixel SPW. However, it is not limited thereto, one pixel P may include three sub-pixels SP or five sub-pixels SP. The sub-pixels SP may be arrayed with a predetermined distance (or gap) from each other. Further, the pixels P may be arrayed with a predetermined distance (or gap) from each other. FIG. 1 shows an exemplary array in which the pixel gap between the pixels P may be wider than the sub-pixel gap between the sub-pixels SP. For another example, all sub-pixels SP may be arrayed with the sub-pixel gap without distinction between the pixel gap and the sub-pixel gap.

Figure 2:
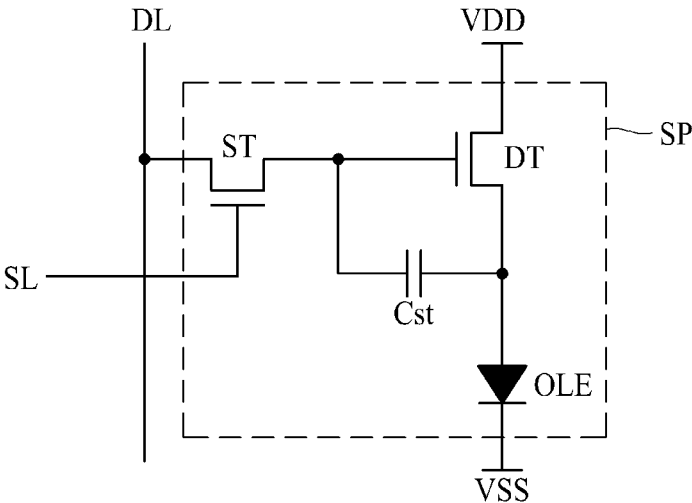
FIG. 2 is a circuit diagram illustrating a structure of one sub-pixel included in the electroluminescence display according to the present disclosure.
Figure 3:
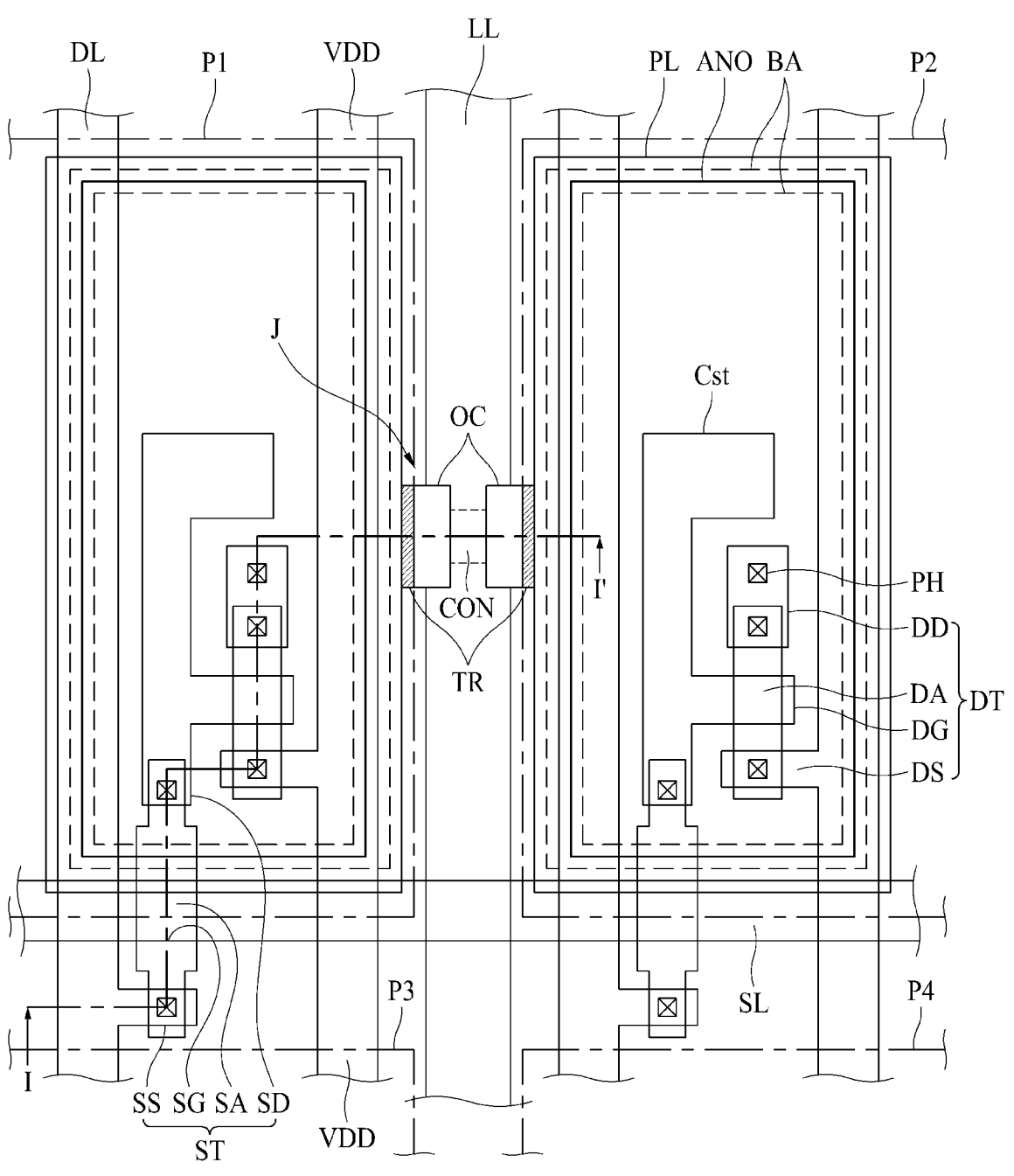
FIG. 3 is an enlarged plan view illustrating a structure between two neighboring pixels arrayed as shown in FIG. 1.
Figure 4:
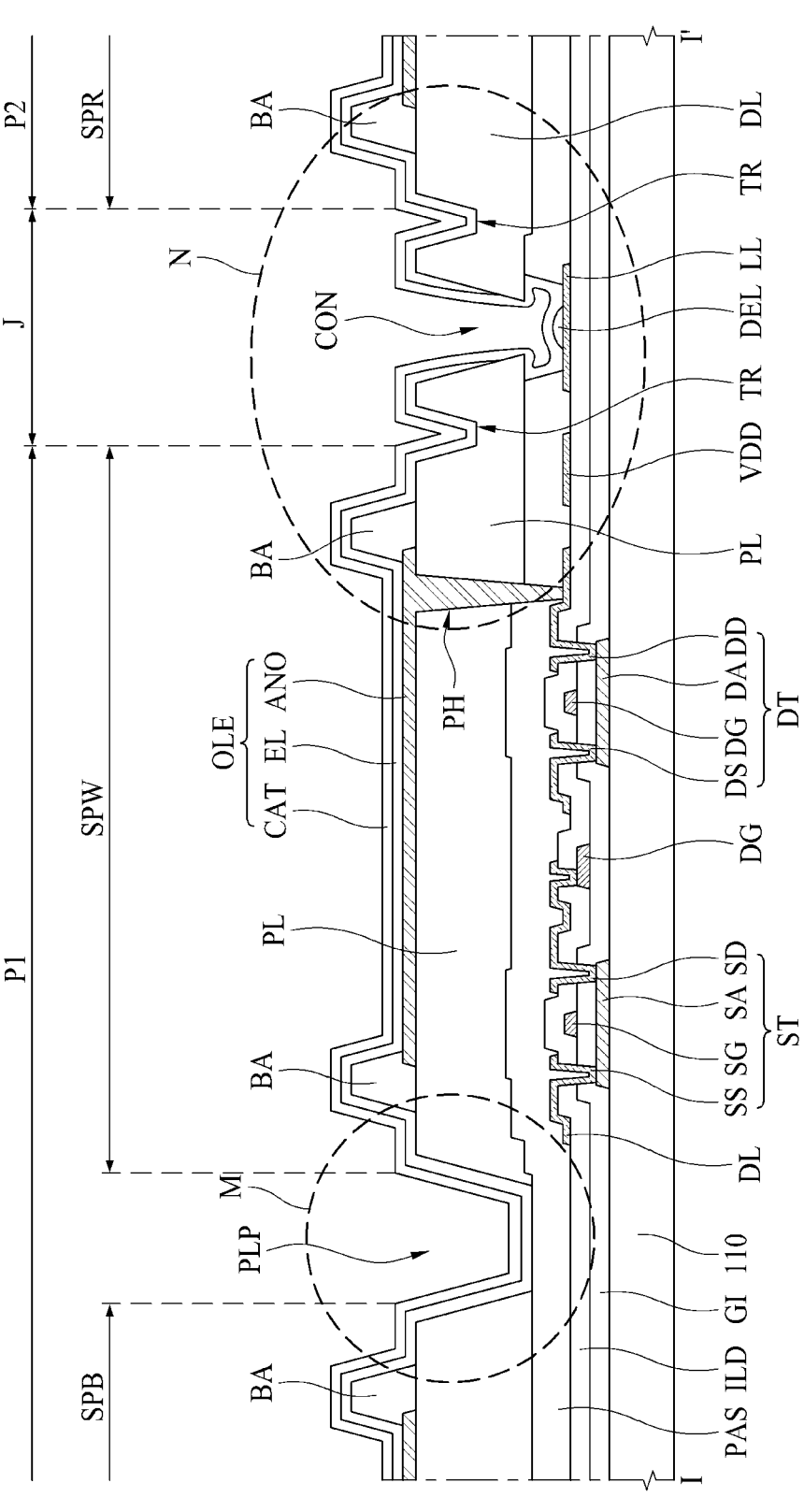
FIG. 4 is a cross-sectional view along cutting line I-I' in FIG. 3, for illustrating the electroluminescence display according to a preferred embodiment of the present disclosure.

FIG. 2 is a circuit diagram illustrating a structure of one sub-pixel included in the electroluminescence display according to the present disclosure. FIG. 3 is an enlarged plan view illustrating a structure between two neighboring pixels arrayed as shown in FIG. 1. FIG. 4 is a cross-sectional view along cutting line I-I' in FIG. 3, for illustrating the electroluminescence display according to a preferred embodiment of the present disclosure. In particular, FIG. 3 shows the planar structure focusing on the circular part 'J' in FIG. 1.

Referring to FIGS. 2 to 3, one sub-pixel SP of the light emitting display may be defined by a scan line SL, a data line DL and a driving current line VDD. One sub-pixel SP of the light emitting display may include a switching thin film transistor ST, a driving thin film transistor DT, a light emitting diode OLE and a storage capacitance Cst. The driving current line VDD may be supplied with a high-level voltage for driving the light emitting diode OLE.

A switching thin film transistor ST and a driving thin film transistor DT may be formed on a substrate SUB. For example, the switching thin film transistor ST may be disposed at the portion where the scan line SL and the data line DL is crossing. The switching thin film transistor ST may include a switching gate electrode SG, a switching source electrode SS and a switching drain electrode SD. The switching gate electrode SG may be connected to the scan line SL, or be one portion of the scan line SL as shown in FIG. 3. The switching source electrode SS may be connected to the data line DL and the switching drain electrode SD may be connected to the driving thin film transistor DT. By supplying the data signal to the driving thin film transistor DT, the switching thin film transistor ST may play a role of selecting a pixel which would be driven.

The driving thin film transistor DT may play a role of driving the light emitting diode OLE of the selected pixel by the switching thin film transistor ST. The driving thin film transistor DT may include a driving gate electrode DG, a driving source electrode DS and a driving drain electrode DD. The driving gate electrode DG may be connected to the switching drain electrode SD of the switching thin film transistor ST. For example, the driving gate electrode DG may be connected to the switching drain electrode SD via the drain contact hole DH penetrating the gate insulating layer GI. The driving source electrode DS may be connected to the driving current line VDD, and the driving drain electrode DD may be connected to an anode electrode ANO of the light emitting diode OLE. A storage capacitance Cst may be disposed between the driving gate electrode DG of the driving thin film transistor DT and the anode electrode ANO of the light emitting diode OLE.

The driving thin film transistor DT may be disposed between the driving current line VDD and the light emitting diode OLE. The driving thin film transistor DT may control the amount of electric currents flowing to the light emitting diode OLE from the driving current line VDD according to the voltage level of the driving gate electrode DG connected to the switching drain electrode SD of the switching thin film transistor ST.

The light emitting diode OLE may include an anode electrode ANO, a light emitting layer EL and a cathode electrode CAT. The light emitting diode OLE may emit light according to the amount of the electric current controlled by the driving thin film transistor DT. In other words, the light emitting diode OLE may be driven by the voltage differences between the low-level voltage and the high-level voltage controlled by the driving thin film transistor DT. The anode electrode ANO of the light emitting diode OLE may be connected to the driving drain electrode DD of the driving thin film transistor DT, and the cathode electrode CAT may be connected to a low-level voltage line Vss where a low-level potential voltage is supplied. That is, the light emitting diode OLE may be driven by the high-level voltage controlled by the driving thin film transistor DT and the low-level voltage supplied from the low-level voltage line Vss.

Hereinafter, further referring to FIGS. 3 and 4 enlarging the circular part 'J' in FIG. 1, the connection structure of the low-resistance line and the cathode electrode will be described. The semiconductor layers SA and DA may be formed on the substrate 110. The semiconductor layer may include a switching semiconductor layer SA of the switching thin film transistor ST and a driving semiconductor layer DA of the driving thin film transistor DT. The gate insulating layer GI is deposited on the semiconductor layer SA and DA to cover the entire substrate 110.

The gate electrodes SG and DG may be formed on the gate insulating layer GI overlapped with the gate line SL and the semiconductor layers SA and DA. The gate electrode may include a switching gate electrode SG of the switching thin film transistor ST and a driving gate electrode DG of the driving thin film transistor DT. The switching gate electrode SG may be branched from the gate line SL or may be defined as one portion of the gate line SL. The intermediate insulating layer ILD may be deposited on the gate line SL and the gate electrode SG and DG to cover the entire substrate 110.

On the intermediate insulating layer ILD, the source electrodes SS and DS, the drain electrodes SD and DD, the low-resistance line LL, the data line DL and the driving current line VDD may be disposed. The source electrodes may include a switching source electrode SS of the switching thin film transistor ST and a driving source electrode DS of the driving thin film transistor DT. The drain electrodes may include a switching drain electrode SD of the switching thin film transistor ST and a driving drain electrode DD of the driving thin film transistor DT. The source electrode SS and DS may contact one side of the semiconductor layer SA and DA via a contact hole penetrating the intermediate insulating layer ILD and the gate insulating layer GI. The drain electrode SD and DD may contact the other side of the semiconductor layer SA and DA via another contact hole penetrating the intermediate insulating layer ILD and the gate insulating layer GI.

The switching source electrode SS may be branched from the data line DL. The switching drain electrode SD may be connected to the driving gate electrode DG and the driving thin film transistor DT. The driving source electrode DS may be branched from the driving current line VDD. The low-resistance line LL may be disposed between two neighboring pixel columns. In some cases, one low-resistance line LL may be disposed at every two or three pixel-columns. The low-resistance line LL may be connected to the cathode electrode CAT of the light emitting diode OLE. Otherwise, the low-resistance line LL may be connected to the low-voltage line VSS. In some cases, the low-resistance line LL may be the low-voltage line VSS.

The passivation layer PAS may be deposited on the substrate 110 having the thin film transistors ST and DT. The passivation layer PAS may be made of an inorganic material including silicon oxide or silicon nitride. The planarization layer PL may be deposited on the passivation layer PAS. The planarization layer PL may be the thin film for flattening the non-uniform surface of the substrate 110 on which the thin film transistors ST and DT are formed. In order to make the uneven surface condition of the substrate 110, the planarization layer PL may be formed of an organic material. The passivation layer PAS and the planarization layer PL may include the pixel contact hole PH exposing some portions of the driving drain electrode DD of the driving thin film transistor DT.

The anode electrode ANO may be formed on the planarization layer PL covering the thin film transistors ST and DT. The anode electrode ANO may be connected to the driving drain electrode DD of the driving thin film transistor DT through a pixel contact hole PH formed at the planarization layer PL. The anode electrode ANO may have various structures and different materials according to the emission type of the organic light emitting diode OLE. For example, for the bottom emission type in which the light may be provided to the substrate 110 direction from the emission layer EL, the anode electrode ANO may be made of a transparent conductive material. For example, the anode electrode ANO of the bottom emission type may include oxide conductive material such as indium-zinc-oxide (or IZO) or indium-tin-oxide (or ITO). For another example, for the top emission type in which the light may be provided to the upper direction opposite the substrate 110, the anode electrode ANO may be made of metal materials having excellent light reflectance.

A bank BA may be formed on the anode electrode ANO. The bank BA may cover the circumference areas of the anode electrode ANO and may expose most of middle areas of the anode electrode ANO, so the bank BA may define the emission area. In other words, the bank BA may cover a portion of the top surface at the edge of the top surface and a corresponding portion of the side surface of the anode electrode ANO and may expose most of the middle area of the anode electrode ANO, so the bank BA may define the emission area as shown in FIG. 4.

An emission layer EL may be deposited on the anode electrode ANO and the bank BA. The emission layer EL may be deposited over the entire surface of the display area DA on the substrate 110, covering the anode electrodes ANO and banks BA. For an example, the emission layer EL may include two or more stacked emission portions for emitting white light. In detail, the emission layer EL may include a first emission layer providing first color light and a second emission layer providing second color light, for emitting the white light by combining the first color light and the second color light.

For another example, the emission layer EL may include any one of the blue emission layer, the green emission layer and the red emission layer for providing the light color corresponding to the color allocated at the pixel. In addition, the light emitting diode OLE may further include functional layers for enhancing the light emitting efficiency and/or life-time of the emission layer EL.

The cathode electrode CAT may be disposed on the emission layer EL. The cathode electrode CAT may be stacked on the emission layer EL as being in surface contact with each other. The cathode electrode CAT may be formed as one sheet element over the entire area of the substrate 110 as being commonly connected whole emission layers EL disposed at all pixels. In the case of the bottom emission type, the cathode electrode CAT may include metal material having excellent light reflection ratio. For example, the cathode electrode CAT may include at least any one of silver (Ag), aluminum (Al), molybdenum (Mo), titanium (Ti), copper (Cu), gold (Au), magnesium (Mg), calcium (Ca) or barium (Ba).

The electroluminescence display according to the present disclosure may include a sub-pixel trench PLP which is formed by patterning the planarization layer PL. The sub-pixel trench PLP may be disposed as surrounding each of the sub-pixel, so that it may distinguish any one sub-pixel SP form the neighboring sub-pixel SP. On the planarization layer PL surrounded by the sub-pixel trench PLP, there is one of anode electrode ANO and bank BA. The bank BA may be disposed between end of the anode electrode ANO and end of the planarization layer PL surrounded by the sub-pixel trench PLP. That is, the bank BA may have a structure of patterned along the circumference area of the anode electrode ANO. Here, the terms of 'sub-pixel trench' is referred when a sub-pixel is used as a basic unit. When a 'sub-pixel' may be referred to as a 'pixel' and a 'pixel' is described as a basic unit, it may be referred to as a 'pixel trench'.

In addition, the electroluminescence display according to the present disclosure may include a cathode contact hole CON for connecting the low-resistance line LL and the cathode electrode CAT. The cathode contact hole CON may be formed by penetrating the passivation layer PAS and the planarization layer PL covering the low-resistance line LL. In particular, the passivation layer PAS stacked under the planarization layer PL may have an under-cut profile formed by being over-etched than the planarization layer PL.

At the cathode contact hole CON having the under-cut structure, the emission layer EL may be deposited only at a middle area of the low-resistance line LL exposed by the cathode contact hole CON. The emission layer EL may include an organic material. For the case that the emission layer EL includes the organic material, the emission layer EL may not be stacked on the etched side wall at the under-cut area, but on some of the exposed area of the surface. Since this stacked portion is not connected to the emission layer EL, it is referred to as a 'dummy emission layer DEL'. On the other hand, the cathode electrode CAT stacked on the emission layer EL may be also stacked from the under-cut portion to the etched side wall and the top surface. As a result, the cathode electrode CAT may extend from one pixel P1 through the cathode contact hole CON to the neighboring pixel P2, and then may be connected to the low-resistance line LL.

Further, the electroluminescence display according to the present disclosure may include an under-cut trench TR between cathode contact hole CON and the bank BA. The under-cut trench TR may be an element for preventing the end portion of the planarization layer PL from being damaged at the under-cut portion forming the cathode contact hole CON.

Figure 5:
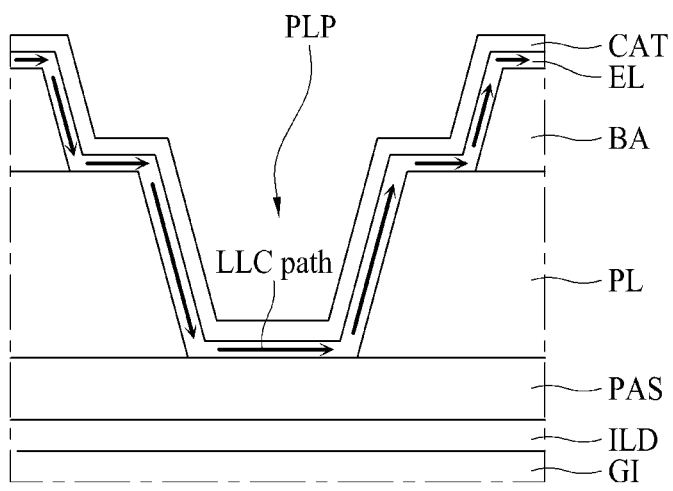
FIG. 5 is an enlarged cross-sectional view of the circular part 'M' in FIG. 4.
Figure 6:
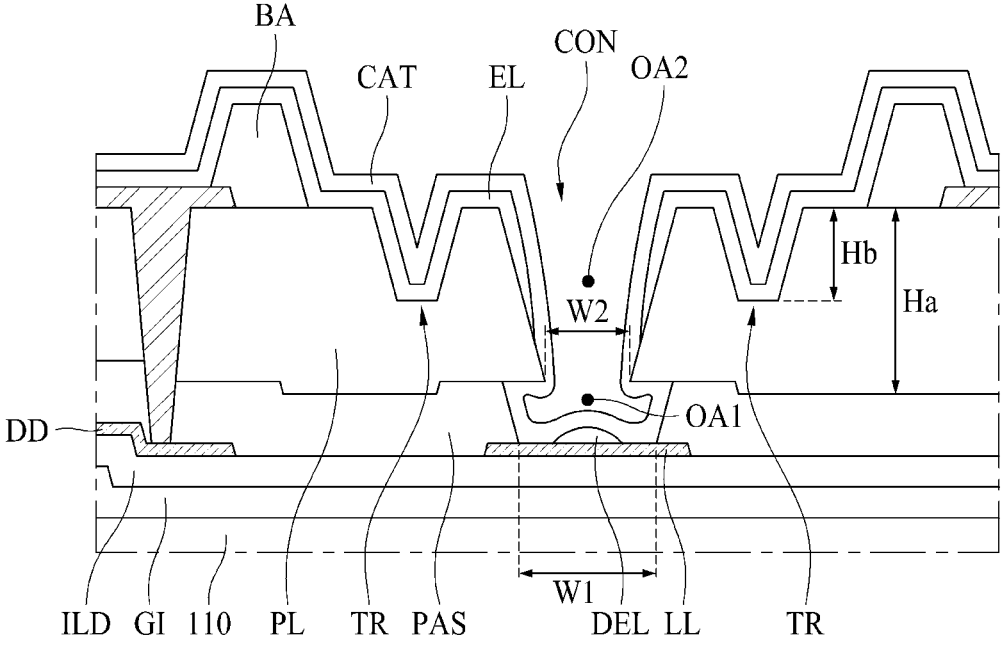
FIG. 6 is an enlarged cross-sectional view of the circular part 'N' in FIG. 4.

Hereinafter, referring to enlarged figures, the sub-pixel trench PLP, the cathode contact hole CON and the under-cut trench TR will be explained in detail. FIG. 5 is an enlarged cross-sectional view of the circular part 'M' in FIG. 4. FIG. 6 is an enlarged cross-sectional view of the circular part 'N' in FIG. 4.

Whether the emission layer emits white light or emits different color lights allocated in each sub-pixel, the functional layer which is a part of the emission layer may be formed as a common layer covering the entire surface of the substrate. For example, the hole injection layer and the hole transport layer stacked just over the anode electrode ANO, and the electron injection layer and the electron transport layer stacked just under the cathode electrode CAT may be formed as a continuous common layer covering the banks BA and the sub-pixels SP. That is, most of the emission layer EL may be stacked on all of the display area DA of the substrate 110.

As the pixel density (unit, PPI: Pixel Per Inch), which means the numbers of the pixels P arranged per unit length, increases, the size of the pixel P becomes smaller, and the distance between the neighboring pixels P becomes narrower. In this case, electrons or charges may move in a lateral direction through the functional layers connecting between the neighboring sub-pixels SP, thereby affecting the function and/or operation of the neighboring sub-pixel SP. This flow of the electrons or charges between neighboring sub-pixels SP may be defined as lateral leakage current (or LLC). As lateral leakage current increases, color information of an image may be distorted and thus image quality may be deteriorated.

In order to prevent such image quality deterioration, the electroluminescence display according to the present disclosure may further include a sub-pixel trench PLP formed by removing some parts of the planarization layer PL, so as to distinguish each sub-pixel SP. The passivation layer PAS stacked under the planarization layer PL may be exposed through the sub-pixel trench PLP. However, it is not limited thereto. In other embodiments, the sub-pixel trench PLP may have a depth lower than the thickness of the planarization layer PL so that the passivation layer PAS may not be exposed.

With the sub-pixel trench PLP, the emission layer EL stacked on this portion may have longer path of current between neighboring sub-pixels SP. For an example, as indicated by the arrow in FIG. 5, the path of the lateral leakage current along the functional layers connected between the neighboring sub-pixels SP may become longer. As a result, the lateral leakage current transferred from one sub-pixel SP to the neighboring sub-pixel SP may be suppressed, thereby preventing image quality from being deteriorated. In particular, as the depth of the sub-pixel trench PLO increases, the thickness of the emission layer EL stacked on the etched sidewall may decrease. In this case, the electrical resistance may be increased in the emission layer EL through which the lateral leakage current is transmitted so that the lateral leakage current may not be easily flow.

Next, referring to FIG. 6, the cross-sectional structures of the cathode contact hole CON and the under-cut trench TR may be explained in detail. In the case of a large-area display having a long diagonal length, the area of the cathode electrode may be increased, and the sheet resistance of the cathode electrode having a relatively thin thickness may increase. In the case of the top emission type, the cathode electrode CAT may be preferably formed of a transparent conductive material such as ITO (Indium-Tin-Oxide) or IZO (Indium-Zinc-Oxide). ITO and IZO may have relatively high sheet resistance than that of metal materials. As the sheet resistance of the cathode electrode is increased, the voltage of the cathode electrode may not be constantly maintained over the entire display screen, and thus image quality may be non-uniformed.

In order to implement an ultra-high-resolution large area electroluminescence display, it may be preferable to have a top emission type capable of ensuring a light emitting area enough to have same luminance with lower power consumption. Accordingly, in the ultra-high-resolution large area electroluminescence display, it is preferable to include a low resistance line LL for lowering the sheet resistance of the cathode electrode. The low resistance line LL may be connected to the cathode electrode CAT stacked on the emission layer EL to lower the sheet resistance of the cathode electrode CAT. In particular, it is preferable to connect the low resistance line LL and the cathode electrode CAT through the cathode contact hole CON distributed in a uniform distribution over the display area.

Referring to FIG. 6, the electroluminescence display according to the present disclosure may include a cathode contact hole CON at the planarization layer PL on which the light emitting diode OLE may be disposed. The cathode contact hole CON may expose some portions of the low resistance line LL by removing some portions of the passivation layer PAS and the planarization layer PL covering the low resistance line LL. In detail, the passivation layer PAS may have a first aperture OA1 having a first width W1. The passivation layer PL may have a second aperture OA2 having a second width W2. Further, the first width W1 may be wider than the second width W2, and the first aperture OA1 and the second aperture OA2 are disposed so that their center points are overlapped each other.

The cathode contact hole CON may be formed after the anode electrode ANO is patterned, the bank BA is formed, the planarization layer PL exposed between the banks BA is patterned, and then the passivation layer PAS is etched. Here, the passivation layer PAS may be over-etched to form the first aperture OA1 wider than the second aperture OA2 formed at the planarization layer PL. As the result, the cathode contact hole COM may be formed as having the under-cut structure.

After forming the cathode contact hole CON, the emission layer EL may be deposited on the substrate 110 as covering whole of the display area DA. The emission layer EL may be formed of an organic material. The emission layer EL may be stacked only on the area vertically exposed by the cathode contact hole CON. Meanwhile, in the cathode contact hole CON, the emission layer EL may be only partially stacked on the inclined side wall which is formed by etching of the planarization layer PL. The emission layer EL may be disconnected at the cathode contact hole CON by the under-cut structure of the cathode contact hole CON.

Thereafter, the cathode electrode CAT may be deposited on the emission layer EL as covering the entire surface of the substrate 110. The cathode electrode CAT may be formed of a transparent conductive material such as ITO or IZO. These transparent conductive materials may be inorganic materials, and when it is stacked on a stepped surface, the step-coverage is very excellent. As the result, the cathode electrode may be deposited along the etched sidewall even inside the cathode contact hole CON having an under-cut structure. Since the cathode electrode CAT is stacked while covering all inside surfaces of the cathode contact hole CON as shown in FIG. 6, it has a continuous structure over the entire area of the substrate 110 without disconnection.

As a result, the cathode electrode CAT may contact the low resistance line LL exposed by the cathode contact hole CON. That is, since the emission layer EL does not completely cover the surface of the low resistance line LL exposed to the cathode contact hole CON, the cathode electrode CAT is connected to the low resistance line LL.

In addition, the under-cut trench TR may be formed at the planarization layer PL disposed between the bank BA and the cathode contact hole CON. The under-cut trench TR may be an element provided to completely maintain the structure of the cathode contact hole CON having the under-cut structure.

The under-cut trench TR may be a trench formed by removing a partial thickness of the planarization layer PL. For example, Ha:Hb, which is a ratio of the thickness Ha of the planarization layer PL to the depth Hb of the under-cut trench TR, may have a value greater than or equal to 4:3. Meanwhile, the depth Hb of the under-cut trench TR may be equal to or smaller than the thickness Ha of the maximum planarization layer PL. That is, the ratio relationship between the depth Hb of the under-cut trench TR and the thickness Ha of the planarization layer PL may be selected from any one value within the range of $4:3 \leq Ha:Hb \leq 1:1$.

Figure 7:
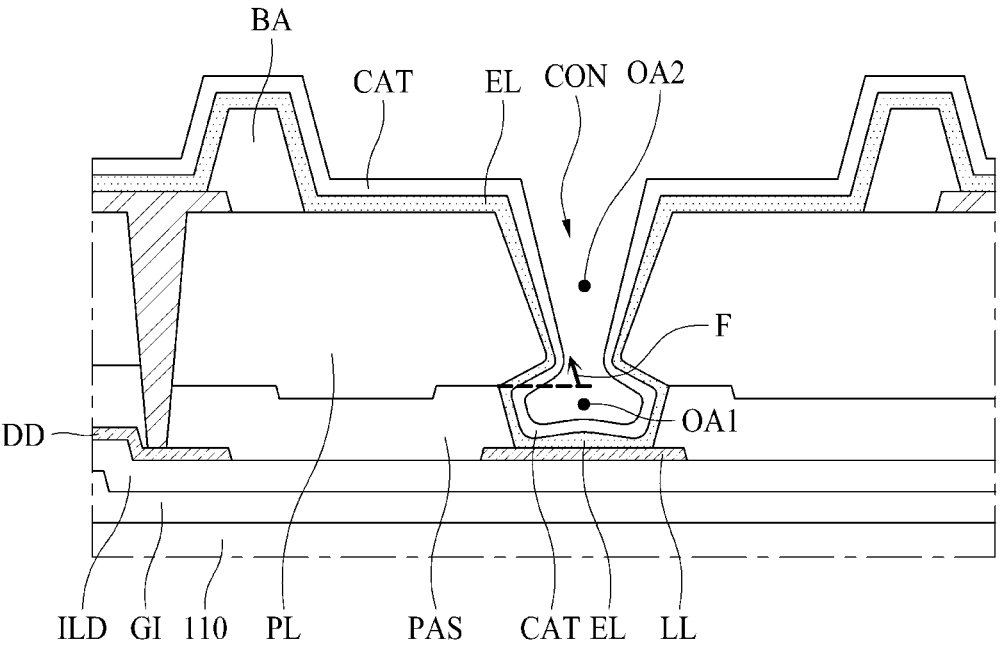
FIG. 7 is an enlarged cross-sectional view illustrating a structure of the electroluminescence display without the under-cut trench according to the present disclosure.

Hereinafter, referring to FIG. 7, the reason for forming the under-cut trench TR and its effect will be described. FIG. 7 is an enlarged cross-sectional view illustrating a structure of the electroluminescence display without the under-cut trench according to the present disclosure. FIG. 7 shows the cross-sectional structure of the cathode contact hole CON, in the case that the under-cut trench TR is not formed around the cathode contact hole CON.

Referring to FIG. 7, after forming the second aperture OA1 by patterning the planarization layer PL without forming the under-cut trench TR, the first aperture OA1 is formed by patterning the passivation layer PAS to form a cathode contact hole CON. Here, as indicated by reference numeral 'F' of FIG. 7, the end of the planarization layer PL may be lifted upward from the horizontal direction. This may occur because the bank BA does not completely cover the entire planarization layer PL, but covers only a partial area of the planarization layer PL. It may be caused by a phenomenon in which the etched end of the planarization layer PL is shrunk during a heat treatment process that may be performed in the over-etching process.

Under this condition, when the emission layer EL is deposited, the emission layer EL may be stacked along the etched sidewall of the cathode contact hole CON. As the result, all of the low resistance line LL exposed to the cathode contact hole CON may be covered by the emission layer EL. Further, since the cathode electrode CAT is subsequently stacked on the emission layer EL, the cathode electrode CAT may not be connected to the low resistance line LL.

On the other hand, as shown in FIG. 6, when the under-cut trench TR is formed, as thermal energy is applied to the planarization layer PL during the etching-process, the thermal stress applied to the planarization layer PL may be distributed through the under-cut trench TR. As the result, a phenomenon in which the etched end of the planarization layer PL is lifted may not be occurred. Accordingly, when the emission layer EL is subsequently deposited, the emission layer EL may expose most of the low resistance line LL in the cathode contact hole CON. Further, when the cathode electrode CAT is deposited, the cathode electrode CAT may be physically and electrically connected to the low resistance line LL.

Figure 8:
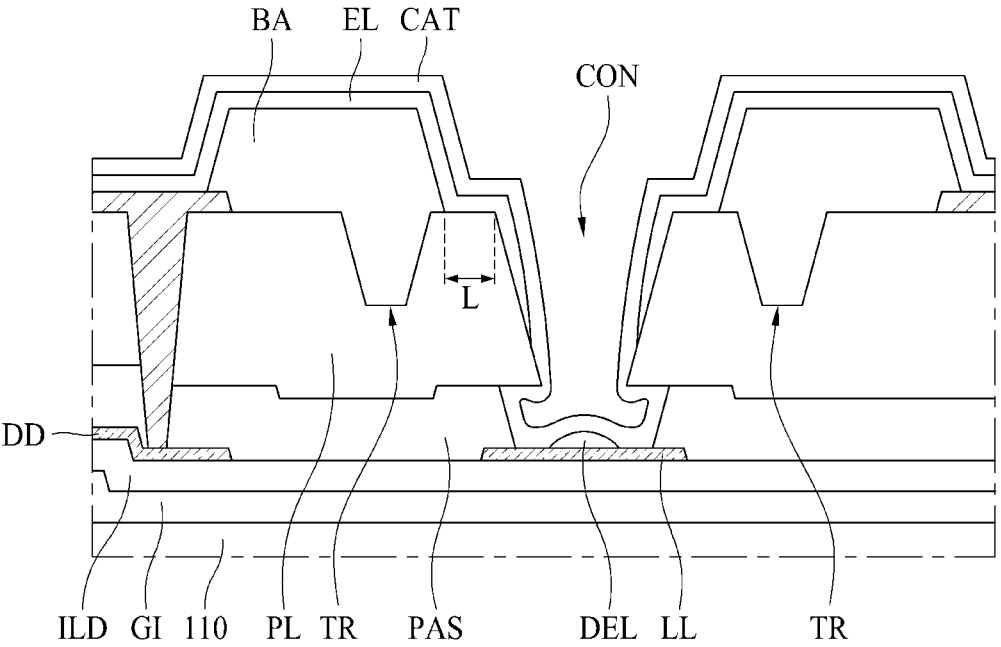
FIG. 8 is a cross-sectional view illustrating the structure of the under-cut trench according to another example of the present disclosure.

Hereinafter, referring to FIG. 8, another structure of the under-cut trench TR according to another embodiment of the present disclosure will be described. FIG. 8 is a cross-sectional view illustrating the structure of the under-cut trench according to another example of the present disclosure. As shown in FIG. 8, the under-cut trench TR according to another example may have a structure completely filled by the bank BA. In this case, the under-cut trench TR may be disposed between the anode electrode ANO and the cathode contact hole CON. With this structure when the cathode contact hole CON having an under-cut structure is formed, the problem that the etched end of the planarization layer PL is lifted may not occur.

Here, the bank BA may be preferably formed to have a smaller width than the planarization layer PL exposed outside the anode electrode ANO. In other words, rather than forming the bank BA to completely cover the planarization layer PL, it is preferable to form the bank BA to be spaced apart from the end of the planarization layer PL by a predetermined distance L inwardly.

Figure 9:
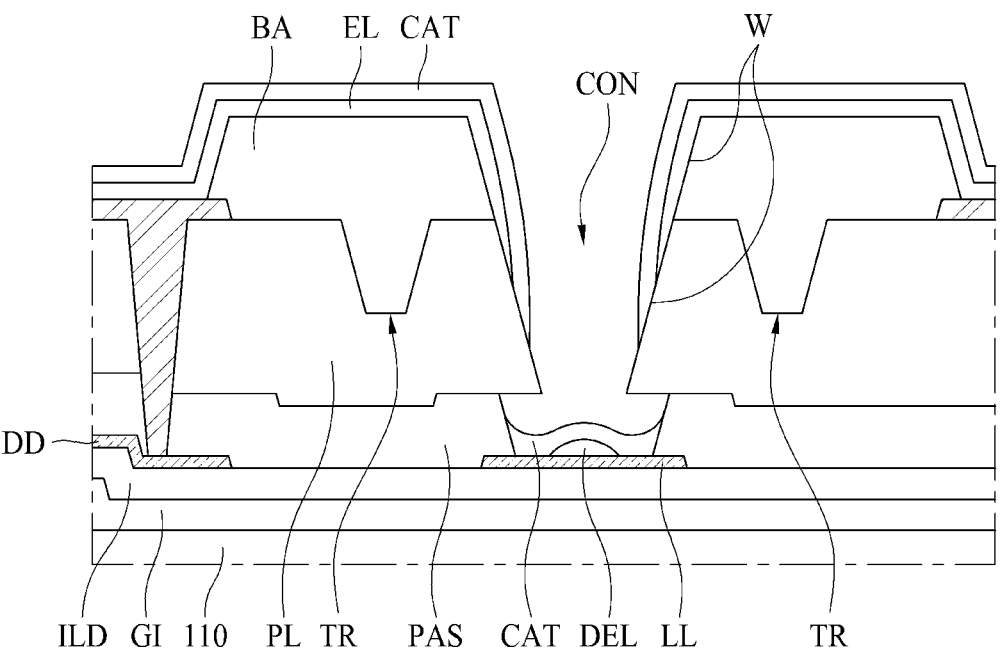
FIG. 9 is an enlarged cross-sectional view illustrating a structure in which a bank and a planarization layer are formed in the same pattern in the electroluminescence display according to the present disclosure.

Hereinafter, referring to FIG. 9, the reason why it is preferable that the bank BA does not completely cover the planarization layer PL will be described. FIG. 9 is an enlarged cross-sectional view illustrating a structure in which a bank and a planarization layer are formed in the same pattern in the electroluminescence display according to the present disclosure.

As shown in FIG. 9, when the bank BA completely covers the planarization layer PL, that is, when the end of the bank BA coincides with the end of the planarization layer PL, the etched sidewall W forming the cathode contact hole CON may have a very steep slope, and the slope length of the sidewall may be also relatively long. For example, the etched sidewall W of the cathode contact hole CON may have a length corresponding to the sum of the thickness of the bank BA and the thickness of the planarization layer PL.

Under this condition, when the emission layer EL is deposited, the entire etched sidewall W may not be covered. The emission layer EL may include organic material. The amount of the deposited of the emission layer EL on the etched sidewall W may be very small. Further, even the cathode electrode CAT which includes inorganic material, may not cover the entire etched sidewall W, and its connectivity may be cut off. As a result, the cathode electrode CAT and the low resistance line LL may not be completely connected in the cathode contact hole CON.

Therefore, it is preferable that the bank BA does not completely cover the planarization layer PL, but the bank BA exposes some portions of the planarization layer PL, as shown in FIGS. 6 and 8. In particular, even in a structure in which the bank BA covers the under-cut trench TR, it is preferable not to completely cover the planarization layer PL.

Figure 10:
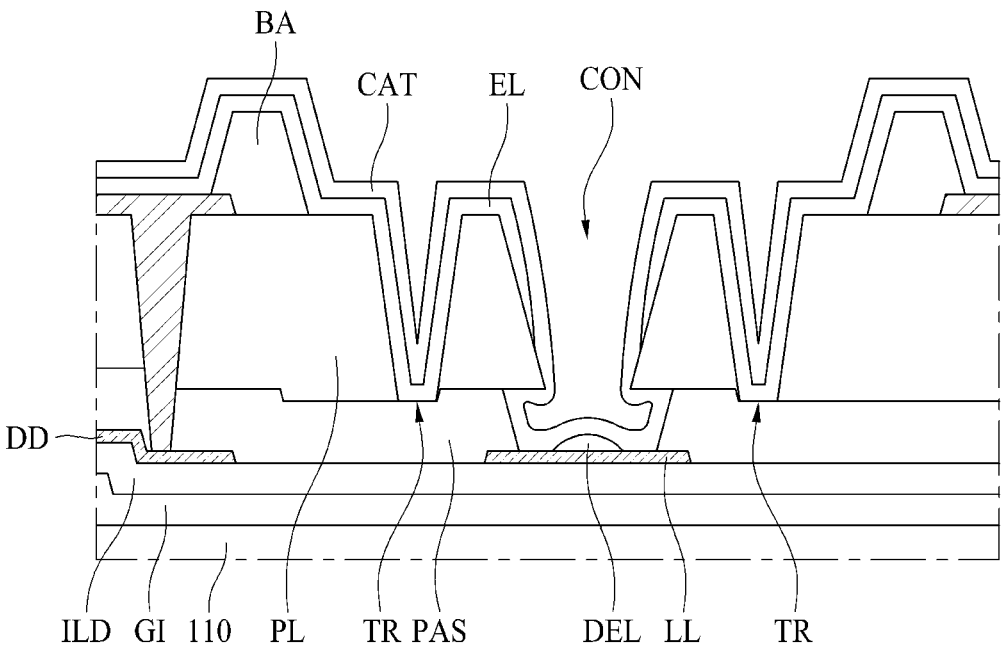
FIG. 10 is a cross-sectional view illustrating a structure of the under-cut trench according to another embodiment of the present disclosure.

Referring to FIG. 10, a structure of the under-cut trench TR according to another example of the present disclosure will be described. FIG. 10 is a cross-sectional view illustrating a structure of the under-cut trench according to another embodiment of the present disclosure. Referring to FIG. 10, the under-cut trench TR according to another embodiment of the present disclosure may have the same depth as the thickness of the planarization layer PL. The depth Hb of the under-cut trench TR is equal to the thickness Ha of the maximum planarization layer PL, in the description using FIG. 6. That is, this is the case where the ratio relationship between the thickness Ha of the planarization layer PL and the depth Hb of the under-cut trench TR is Ha:Hb=1:1.

Figure 11:
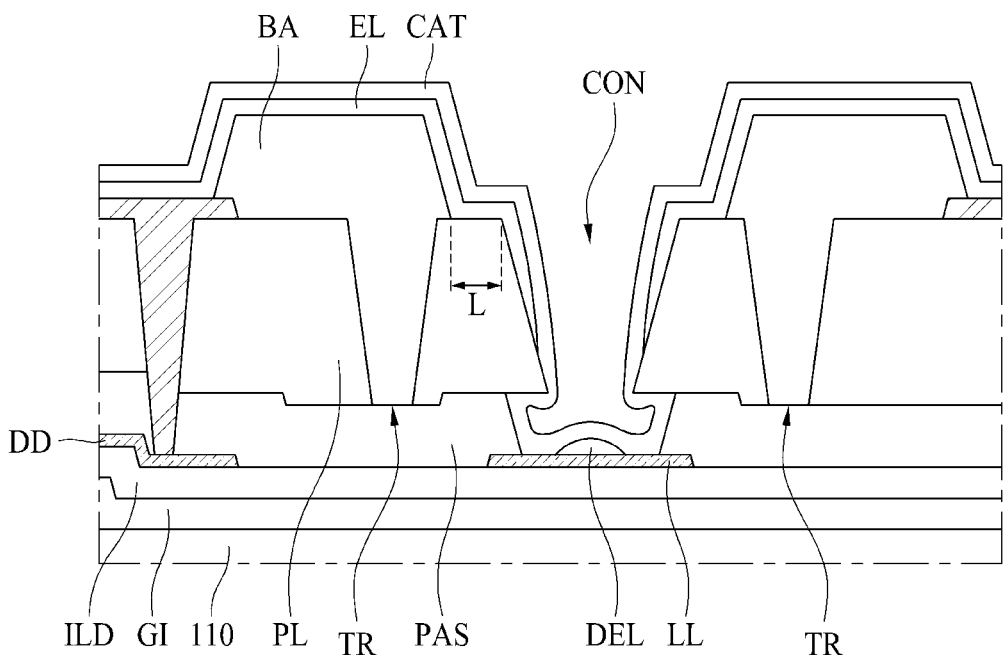
FIG. 11 is a cross-sectional view illustrating a structure of the under-cut trench according to still another embodiment of the present disclosure.

Referring to FIG. 11, a structure of the under-cut trench TR according to still another example of the present disclosure will be described. As shown in FIG. 11, the depth of the under-cut trench TR may be etched corresponding to the same thickness of the planarization layer PL. Further, the bank BA may be formed to completely fill the under-cut trench TR. In this case, the under-cut trench TR may be disposed between the anode electrode ANO and the cathode contact hole CON. Even in this structure, when the cathode contact hole CON having an under-cut structure is formed, the problem that the etched end of the planarization layer PL is lifted may not occur.

At this time, the bank BA is preferably formed to have a smaller width than the planarization layer PL exposed outside the anode electrode ANO. For example, rather than forming the bank BA to completely cover the planarization layer PL, it is preferable to form the bank BA to be spaced apart from the end of the planarization layer PL by a predetermined distance L inward.

Figure 12:
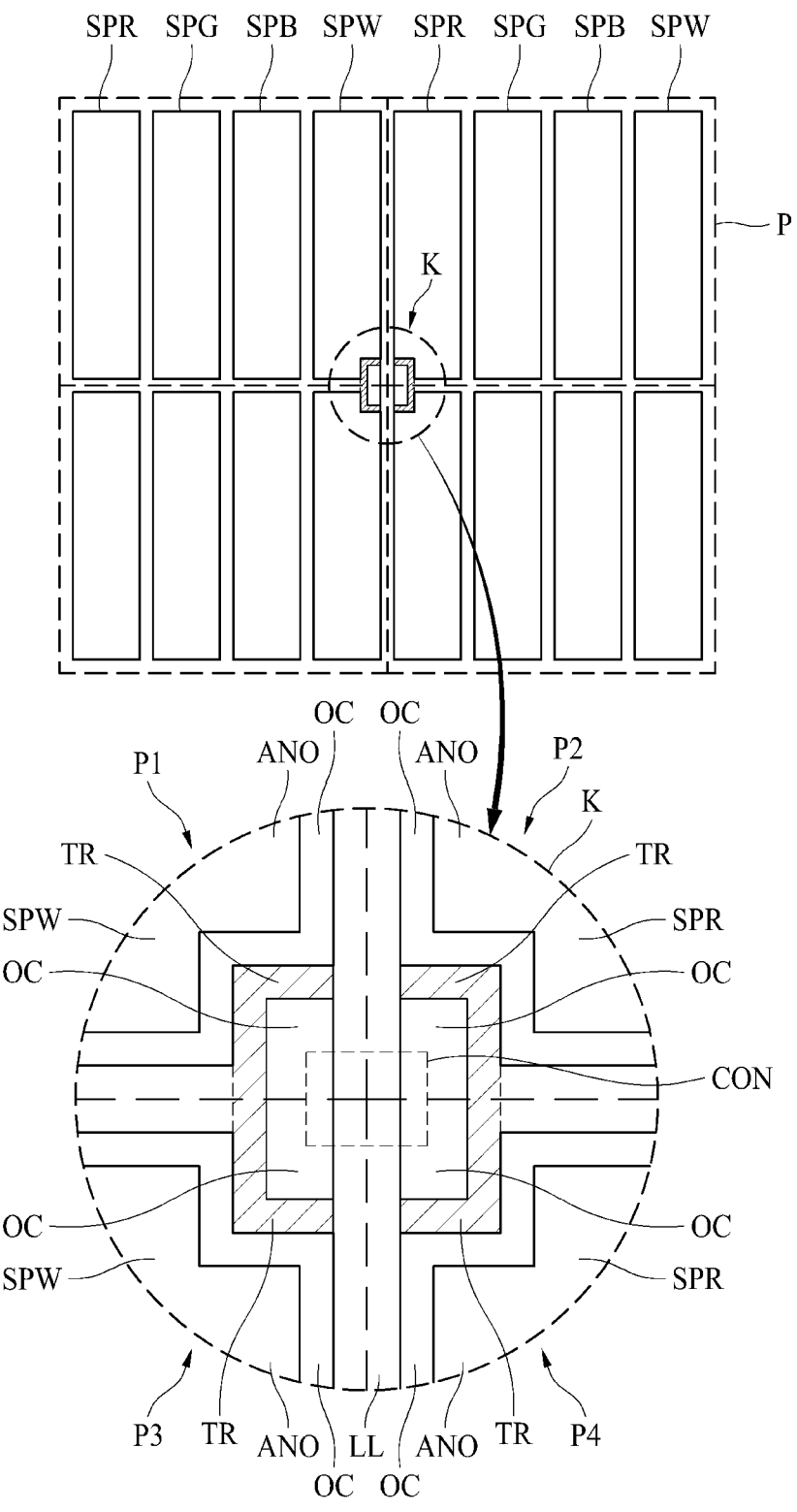
FIG. 12 is a plane view illustrating a structure of the electroluminescence display according to another embodiment of the present disclosure.

Referring to FIG. 12, a structure of the electroluminescence display according to another example of the present disclosure will be described. FIG. 12 is a plane view illustrating a structure of the electroluminescence display according to another embodiment of the present disclosure.

The electroluminescence display shown in FIG. 12 may be a diagram illustrating a case in which the pixel density is very high. For example, in a case in which an ultra-high-resolution having a pixel density of 200 DPI or more is implemented in a large-area top emission type electroluminescence display, all sub-pixels SP disposed in the display area DA may be uniformly spaced apart. In this case, unlike FIG. 1, an interval between the pixels P may not be specifically defined.

With this structure, a low resistance line LL may be disposed between the plurality of sub-pixel columns. A cathode contact hole CON may be formed on the low resistance line LL, and the cathode electrode CAT and the low resistance line LL may be connected via the cathode contact hole CON. However, as the spacing between the sub-pixels SP is very narrow, it may not be easy to form the cathode contact hole CON.

As shown in FIG. 9, the cathode contact hole CON may be formed at the intersection area K where four neighboring pixels P are adjacent. For example, a cathode contact hole CON may be formed at the intersection area K where the white sub-pixel SPW of the first pixel P1, the red sub-pixel SPR of the second pixel P2, the white sub-pixel SPW of the third pixel P3 and the red sub-pixel SPR of the fourth pixel P4 intersect. In order to form the cathode contact hole CON, the areas corresponding to the intersection portions of the four sub-pixels SP may be partially removed to ensure the square intersection area K.

The planarization layer PL and the passivation layer PAS may be patterned in the square intersection area K to form a cathode contact hole CON exposing the low resistance line LL disposed there-under. In addition, it is preferable to form the under-cut trench TR between the anode electrodes ANO around the cathode contact hole CON.

The electroluminescence display according to the present disclosure may include a structure in which the low resistance line LL is disposed between two adjacent sub-pixels SP of two neighboring pixels P, and a cathode contact hole CON is disposed for exposing some portions of the low resistance line LL. In particular, the patterns for forming the cathode contact hole CON may be disposed as overlapping the sub-pixel trench PLP disposed between two anode electrodes ANO disposed at both sides.

In FIG. 3, in order to clearly show the structure of the cathode contact hole CON, it is illustrated as having a shape protruding from the planarization layer PL on both sides. Meanwhile, the cathode contact hole CON may be formed by arranging the planarization layer PL on both sides without a protruding shape, and etching only the passivation layer PAS exposed there-between. On the other hand, FIG. 12 shows a structure in which the low resistance line LL is disposed with a higher resolution. FIG. 12 shows the structure in which the cathode contact hole CON is disposed by forming partially removed regions inside each sub-pixel SP at the portion where the four sub-pixels SP are arranged.

The features, structures, effects and so on described in the above example embodiments of the present disclosure are included in at least one example embodiment of the present disclosure, and are not necessarily limited to only one example embodiment. Furthermore, the features, structures, effects and the like explained in at least one example embodiment may be implemented in combination or modification with respect to other example embodiments by those skilled in the art to which this disclosure is directed. Accordingly, such combinations and variations should be construed as being included in the scope of the present disclosure.

It will be apparent to those skilled in the art that various substitutions, modifications, and variations are possible within the scope of the present disclosure without departing from the scope of the present disclosure. Therefore, it is intended that embodiments of the present disclosure cover the various substitutions, modifications, and variations of the present disclosure, provided they come within the scope of the appended claims and their equivalents. These and other changes can be made to the embodiments in light of the above detailed description. In general, in the following claims, the terms used should not be construed to limit the claims to the specific example embodiments disclosed in the specification and the claims, but should be construed to include all possible embodiments along with the full scope of equivalents to which such claims are entitled. Accordingly, the claims are not limited by the disclosure.

What is claimed is:

1. An electroluminescence display comprising:
   a pixel disposed on a substrate;
   a low resistance line disposed as one side of the pixel;
   a passivation layer on the low resistance line;
   a planarization layer on the passivation layer;
   a cathode contact hole disposed at the planarization layer covering a part of the low resistance line;
   an under-cut structure disposed in the cathode contact hole by over-etching the passivation layer under the planarization layer for exposing a part of the low resistance line;
   an anode electrode disposed on the planarization layer;
   an under-cut trench formed at the planarization layer disposed between the anode electrode and the cathode contact hole;
   a bank on a circumference area of the anode electrode;
   an emission layer on the bank, the anode electrode and the planarization layer; and
   a cathode electrode on the emission layer,
   wherein the cathode electrode is connected to the low resistance line through the cathode contact hole,
   wherein the emission layer is disposed at sidewalls of the planarization layer and on the exposed part of the low resistance line, and
   wherein the emission layer is disconnected between middle portions of the exposed low resistance line and the sidewalls of the planarization layer.

2. The electroluminescence display according to claim 1, further comprising:
   a pixel trench formed by removing a part of the planarization layer around the anode electrode outside of the bank.

3. The electroluminescence display according to claim 2, wherein the emission layer extends to a neighboring pixel through the pixel trench.

4. The electroluminescence display according to claim 2, wherein the cathode contact hole is formed at areas overlapped with the low resistance line at the pixel trench.

5. The electroluminescence display according to claim 1, wherein the cathode contact hole includes:
   a first aperture formed at the passivation layer and having a first width; and
   a second aperture formed through the planarization layer and having a second width narrower than the first width,
   wherein the emission layer is disposed on a part but not all of the low resistance line, and
   wherein the cathode electrode contacts the low resistance line where the emission layer is not disposed on the low resistance line.

6. The electroluminescence display according to claim 1, wherein a ratio of a depth of the under-cut trench to a thickness of the planarization layer is 1:1 to 3:4.

7. The electroluminescence display according to claim 1, wherein the bank is disposed between the anode electrode and the under-cut trench.

8. The electroluminescence display according to claim 1, wherein the bank fills the under-cut trench and covers a part of the planarization layer.

9. The electroluminescence display according to claim 8, wherein the bank does not cover portions of the planarization layer between the under-cut trench and the cathode contact hole.

10. The electroluminescence display according to claim 1, further comprising:

a thin film transistor disposed under the passivation layer and connected to the anode electrode.

11. An electroluminescence display comprising:

a first pixel and a second pixel disposed next to each other on a substrate;

a low resistance line disposed between the first pixel and the second pixel;

a passivation layer on the low resistance line and covering the substrate;

a first planarization layer disposed at the first pixel on the passivation layer;

a second planarization layer disposed at the second pixel on the passivation layer;

a first anode electrode on the first planarization layer;

a second anode electrode on the second planarization layer;

a cathode contact hole exposing a part of the low resistance line between the first planarization layer and the second planarization layer;

a first under-cut structure in the cathode contact hole by over-etching the passivation layer under the first planarization layer for exposing the low resistance line;

a second under-cut structure in the cathode contact hole by over-etching the passivation layer under the second planarization layer for exposing the low resistance line;

a first under-cut trench formed at the first planarization layer between the first anode electrode and the cathode contact hole;

a second under-cut trench formed at the second planarization layer between the second anode electrode and the cathode contact hole;

a first bank covering circumference areas of the first anode electrode;

a second bank covering circumference areas of the second anode electrode;

an emission layer on the first bank, the second bank, the first anode electrode, the second anode electrode, the first planarization layer, the second planarization layer and middle portions of the exposed low resistance line; and a cathode electrode on the emission layer, wherein the cathode electrode is connected to the low resistance line through the cathode contact hole, wherein the emission layer is disconnected between the first pixel and the middle portions of the exposed low resistance line, and between the second pixel and the middle portions of the exposed low resistance line, at the cathode contact hole, and wherein the cathode electrode is connected between the first pixel and the second pixel at the cathode contact hole.

12. The electroluminescence display according to claim 11, further comprising:

a pixel trench disposed between the first planarization layer and the second planarization layer.

13. The display according to claim 12, wherein the emission layer extends from the first pixel to the second pixel via the pixel trench.

14. The electroluminescence display according to claim 11, wherein the cathode contact hole comprises:

a first aperture formed at the passivation layer and having a first width; and a second aperture formed between the first planarization layer and the second planarization layer, and having a second width narrower than the first width, wherein the emission layer is disposed on a part but not all of the low resistance line exposed, and wherein the cathode electrode contacts the low resistance line where the emission layer is not disposed on the low resistance line.

15. The electroluminescence display according to claim 11, wherein a ratio of a depth of the first under-cut trench and a thickness of the first planarization layer is 1:1 to 3:4, and wherein a ratio of a depth of the second under-cut trench and a thickness of the second planarization layer is 1:1 to 3:4.

16. The electroluminescence display according to claim 11, wherein the first bank does not cover the first under-cut trench, and wherein the second bank does not cover the second under-cut trench.

17. The electroluminescence display according to claim 11, wherein the first bank fills the first under-cut trench, and wherein the second bank fills the second under-cut trench.

18. The electroluminescence display according to claim 17, wherein the first bank does not cover a part of the first planarization layer between the first under-cut trench and the cathode contact hole, and wherein the second bank does not cover a part of the second planarization layer between the second under-cut trench and the cathode contact hole.

19. An electroluminescence display comprising:

a first pixel including a first transistor and a first light emitting diode, the first light emitting diode including a first anode, a first emission layer, and a cathode;

a second pixel including a second transistor and a second light emitting diode, the second light emitting diode including a second anode, a second emission layer, and the cathode;

a passivation layer covering the first transistor and the second transistor;

a planarization layer between the passivation layer and the first and second light emitting diodes;

a low resistance line between the first pixel and the second pixel;

a cathode contact hole between the first pixel and the second pixel, the cathode contact hole formed through the planarization layer and through a part of the passivation layer and exposing a part of the low resistance line;

a first bank between the first pixel and the cathode contact hole;

a second bank between the second pixel and the cathode contact hole;

a first undercut trench formed in the planarization layer between the first bank and the cathode contact hole, the first undercut trench spaced apart from the cathode contact hole;

a second undercut trench formed in the planarization layer between the second bank and the cathode contact hole, the second undercut trench spaced apart from the cathode contact hole; and a dummy emission layer formed of a same material as the first emission layer and the second emission layer in the cathode contact hole on the part of the low resistance line exposed by the cathode contact hole, the dummy emission layer electrically disconnected from the first emission layer and the second emission layer, wherein the cathode is formed continuously on sidewalls of the cathode contact hole, the part of the low resistance line, and the dummy emission layer.

20. The electroluminescence display according to claim 19, wherein the first bank fills the first undercut trench and the second bank fills the second undercut trench.

21. The electroluminescence display according to claim 19, wherein the first and the second undercut trenches expose the passivation layer.

\* \* \* \* \*